(12) United States Patent
Park et al.

(10) Patent No.: US 11,947,236 B2
(45) Date of Patent: Apr. 2, 2024

(54) HIGH CONTRAST TRANSPARENT DISPLAY WITH AUTOMATIC SHADING

(71) Applicant: GM GLOBAL TECHNOLOGY OPERATIONS LLC, Detroit, MI (US)

(72) Inventors: Jonglee Park, Troy, MI (US); Chris Wisniewski, Oshawa (CA); Jarvis Chau, Markham (CA)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 444 days.

(21) Appl. No.: 17/241,997

(22) Filed: Apr. 27, 2021

(65) Prior Publication Data

US 2022/0342270 A1 Oct. 27, 2022

(51) Int. Cl.
| | |
|---|---|
| G02F 1/166 | (2019.01) |
| B60K 35/00 | (2006.01) |
| G02B 27/01 | (2006.01) |
| G02F 1/1685 | (2019.01) |
| H01L 25/075 | (2006.01) |
| H01L 33/62 | (2010.01) |

(52) U.S. Cl.
CPC ............ *G02F 1/166* (2019.01); *B60K 35/00* (2013.01); *G02B 27/0101* (2013.01); *G02F 1/1685* (2019.01); *H01L 25/0753* (2013.01); *H01L 33/62* (2013.01); *B60K 2370/1529* (2019.05); *B60K 2370/332* (2019.05); *B60K 2370/52* (2019.05); *B60K 2370/785* (2019.05); *H01L 2933/0066* (2013.01)

(58) Field of Classification Search
CPC ....... G02F 1/166; G02F 1/1685; B60K 35/00; G02B 27/0101; H01L 25/0753; H01L 33/62

USPC .......................................................... 359/296
See application file for complete search history.

(56) References Cited

U.S. PATENT DOCUMENTS

| | | | | |
|---|---|---|---|---|
| 11,320,689 | B1* | 5/2022 | Yang | G02F 1/133531 |
| 2013/0127374 | A1* | 5/2013 | Lin | H10K 59/50 |
| | | | | 315/363 |
| 2014/0049983 | A1* | 2/2014 | Nichol | G02B 6/0018 |
| | | | | 362/610 |
| 2015/0029211 | A1* | 1/2015 | Weber | G09G 3/3622 |
| | | | | 345/592 |
| 2017/0294418 | A1* | 10/2017 | Edmond | H01L 33/46 |

(Continued)

OTHER PUBLICATIONS

U.S. Appl. No. 17/531,287, filed Nov. 19, 2021, Chau et al.

(Continued)

*Primary Examiner* — Tracie Y Green

(57) ABSTRACT

A display device include a first transparent layer, a second transparent layer and a spacer arranged between the first transparent layer and the second transparent layer to define a first region and a second region. A first plurality of electrodes are arranged on an inner surface of the first transparent layer in the first region. A plurality of light emitting diodes (LEDs) are connected to the first plurality of electrodes in the first region. A second plurality of electrodes are arranged on the inner surface of the first transparent layer in the second region. A third plurality of electrodes are arranged on the inner surface of the second transparent layer in the second region. Particles are arranged in the second region between the second plurality of electrodes and the third plurality of electrodes.

20 Claims, 8 Drawing Sheets

(56) References Cited

U.S. PATENT DOCUMENTS

2018/0321568 A1* 11/2018 Moriwaki ............ G02F 1/16766
2020/0361482 A1* 11/2020 Choi ..................... B60W 50/14
2022/0190221 A1* 6/2022 Lee ......................... H01L 33/38

OTHER PUBLICATIONS

Publication titled "High Contrast Transparent Display With Auto Shading"—Disclosed Anonymously in Research Disclosure; digital publication: Oct. 20, 2020; paper publication: Nov. 2020; Questel Ireland Ltd, Killernan, Kilmaine, County Mayo, Ireland.

* cited by examiner

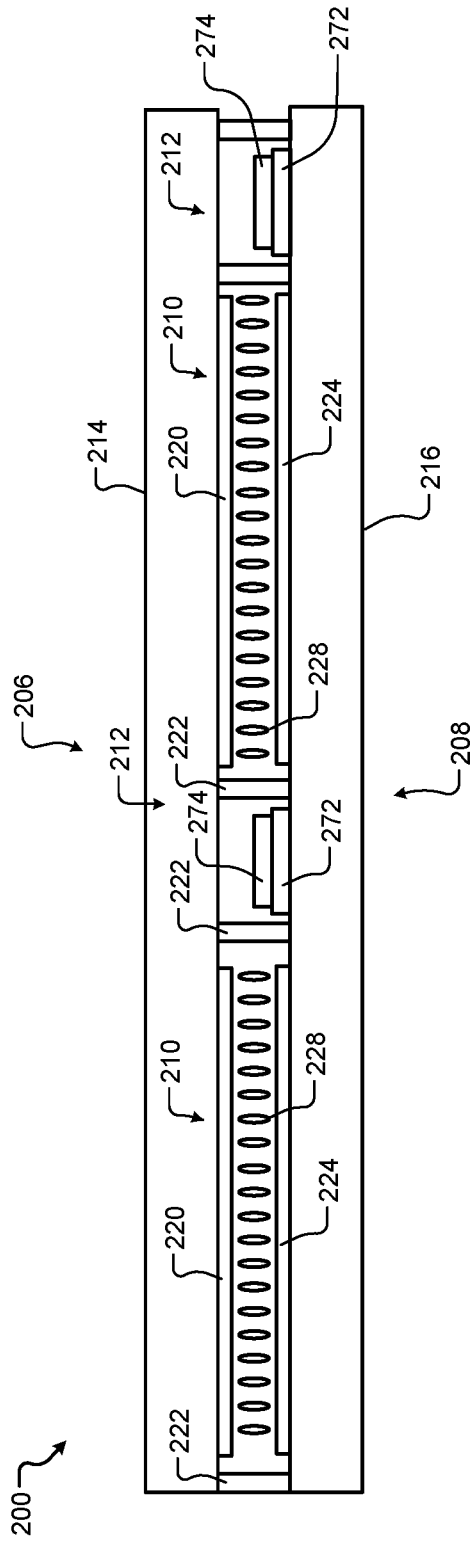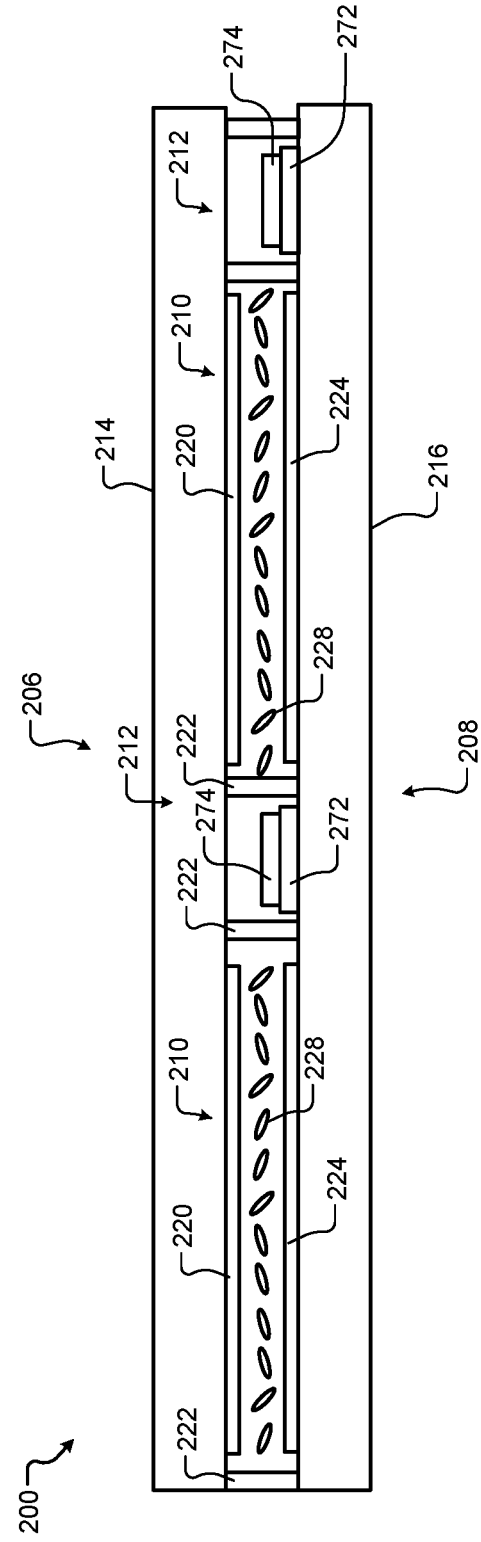

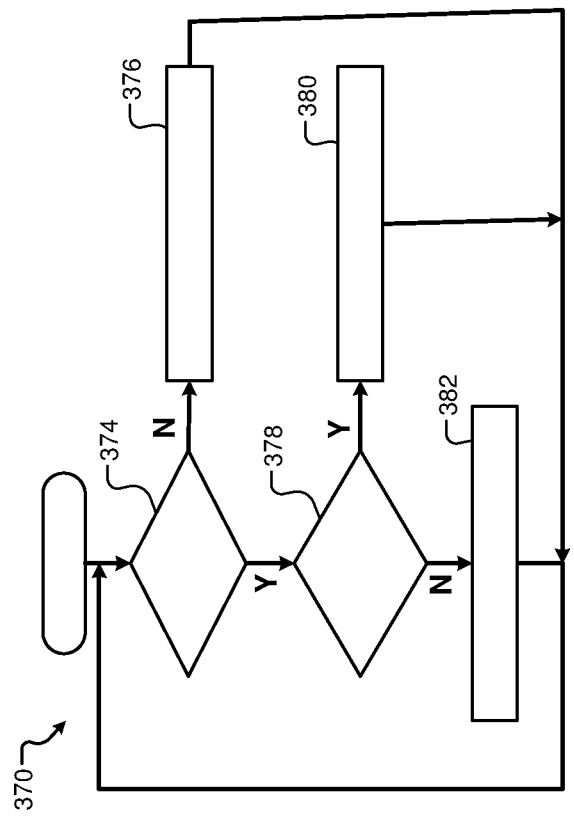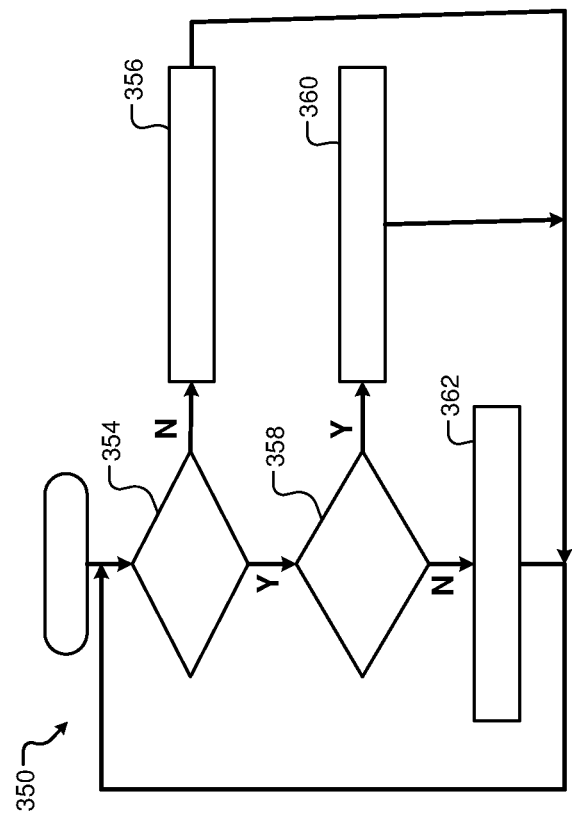

HIGH CONTRAST TRANSPARENT DISPLAY WITH AUTOMATIC SHADING

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to display devices and more particularly to transparent display devices with automatic shading.

A display device may include a light emitting diode (LED) array that is arranged on a transparent layer such as glass. Transparent spaces are located between pixels of the LED array. As the spacing between the LEDs in the LED array increases, the level of transparency of the display device increases. Smaller scale display technologies such as micro LEDs can be used and provide an opportunity to make increasingly transparent display devices.

The display device may be used with variable levels of ambient light. For example, higher levels of ambient light (such as direct sunlight) on a front side or a back side of the display device tend to reduce the contrast of the display device. The lower contrast of the display device in these light conditions makes content such as images or graphics being displayed more difficult to see.

SUMMARY

A display device includes a first transparent layer, a second transparent layer and a spacer arranged between the first transparent layer and the second transparent layer to define a first region and a second region. A first plurality of electrodes are arranged on an inner surface of the first transparent layer in the first region. A plurality of light emitting diodes (LEDs) are connected to the first plurality of electrodes in the first region. A second plurality of electrodes are arranged on the inner surface of the first transparent layer in the second region. A third plurality of electrodes are arranged on the inner surface of the second transparent layer in the second region. Particles are arranged in the second region between the second plurality of electrodes and the third plurality of electrodes.

In other features, a display controller is configured to selectively cause the particles between the second plurality of electrodes and the third plurality of electrodes to align to increase transparency of the display device in the second region. The display controller is configured to selectively cause the particles between the second plurality of electrodes and the third plurality of electrodes to misalign and increase opacity of the display device in the second region.

In other features, the plurality of LEDs comprise micro LEDs. The first transparent layer comprises glass. The first transparent layer comprises transparent film. The second transparent layer comprises glass. The second transparent layer comprises transparent film. The first plurality of electrodes, the second plurality of electrodes and the third plurality of electrodes comprise a conductive coating.

In other features, the display device forms part of a windshield of a vehicle. The display device forms part of a window of a vehicle. The display device is viewed from an interior of a vehicle. A display controller configured to cause the second regions to be opaque in response to an ambient light level being greater than a predetermined light threshold.

In other features, the display device is viewed from an exterior of a vehicle. A display controller configured to cause the second region to be opaque in response to a light level inside the vehicle being greater than a predetermined value. The first plurality of electrodes are configured to supply power individually to each of the plurality of LEDs.

In other features, a fourth plurality of electrodes arranged on the inner surface of the first transparent layer in the second region. A fifth plurality of electrodes arranged on the inner surface of the second transparent layer in the second region. The fourth plurality of electrodes and the fifth plurality of electrodes are not connected to the third plurality of electrodes and the fourth plurality of electrodes.

In other features, the plurality of LEDs are arranged in a first set of rows and the second plurality of electrodes and the third plurality of electrodes define a second set of rows that are arranged between ones of the first set of rows. The plurality of LEDs and pairs of the second plurality of electrodes and the third plurality of electrodes alternate in both row and column directions.

A method for fabricating a display device includes forming a first plurality of electrodes in first regions of an inner surface of a first transparent layer; forming a second plurality of electrodes in second regions of the inner surface of the first transparent layer; forming a third plurality of electrodes in second regions of an inner surface of a second transparent layer; attaching LEDs on the first plurality of electrodes; forming spacers on at least one of the first transparent layer and the second transparent layer between the first regions and the second regions; arranging the first transparent layer parallel to the second transparent layer with the second plurality of electrodes on the first transparent layer aligned with the third plurality of electrodes on the second transparent layer; and injecting particles into the second regions.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a side cross-sectional view of an example of the transparent display device with suspended particles that are aligned for increased transparency in spaces located between pixels according to the present disclosure;

FIG. 4 is a side cross-sectional view of the transparent display device with suspended particles that are misaligned in spaces located between pixels for increased opacity according to the present disclosure;

FIG. 7 is a flowchart of an example of a method for operating a display device viewed from within a vehicle according to the present disclosure;

FIG. 8 is a flowchart of an example of a method for operating a display device viewed from outside of a vehicle according to the present disclosure.

In the drawings, reference numbers may be reused to identify similar and/or identical elements.

DETAILED DESCRIPTION

Figure 1A:
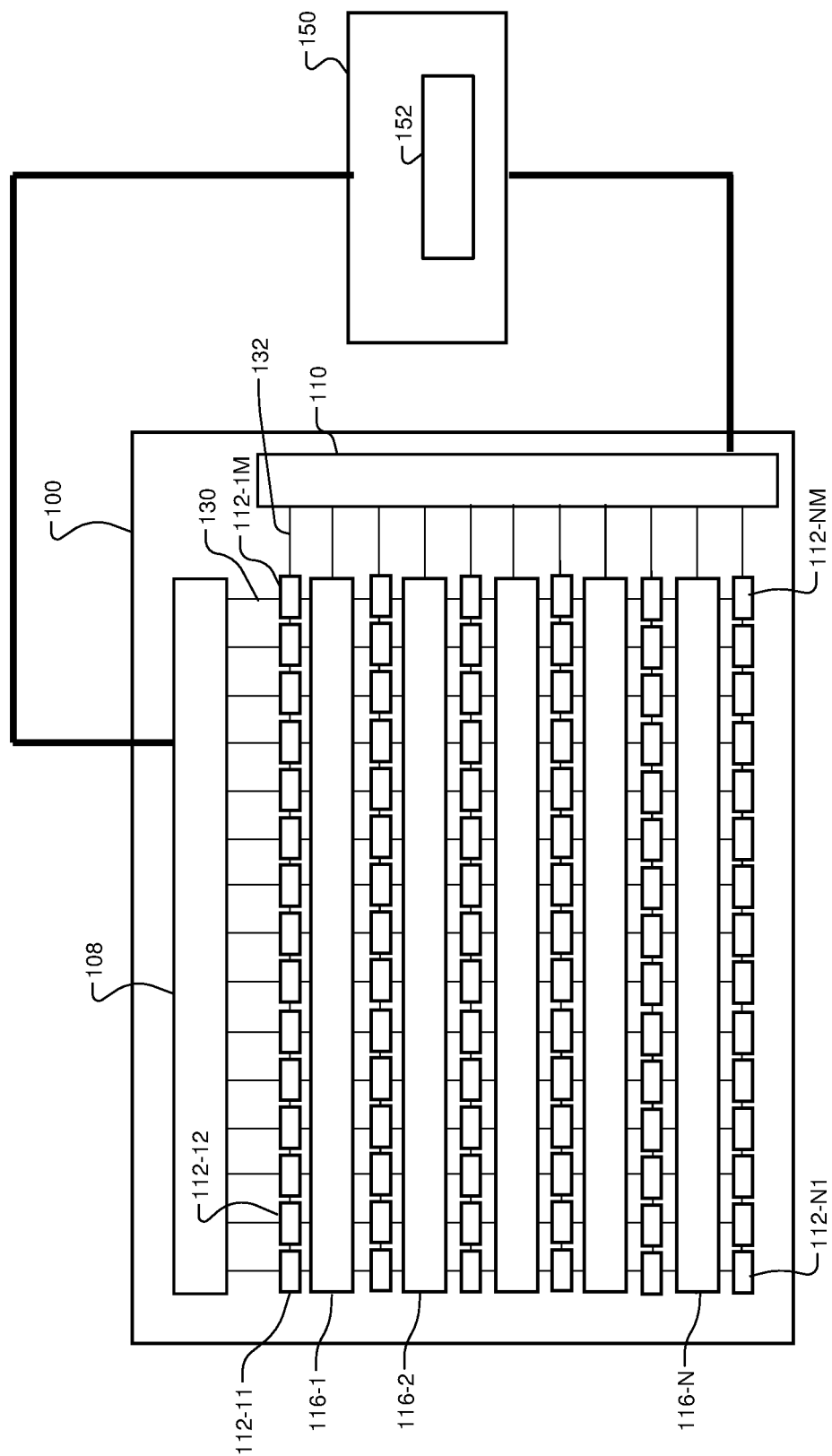
FIGS. 1A and 1B illustrate examples of transparent display devices including an array of LEDs with defining selectively transparent spaces between the pixels according to the present disclosure.

The present disclosure relates to a transparent display device with high contrast. While the foregoing description relates to transparent display devices with auto shading for vehicles, the transparent display devices described herein can be used in any other application such as residential homes, commercial buildings, computer games, etc.

A display device can be made transparent by arranging selectively transparent spaces between pixels of the display device and controlling the transparency or opacity thereof. Smaller scale display technologies such as micro light emitting diodes (LEDs) have more opportunity to make higher transparency display devices. However, the higher transparency of the display device reduces the contrast ratio due to undesired lighting from surroundings. For example, when the display is exposed to high ambient light conditions such as sunlight, readability worsens.

Auto shading devices can be used to change light transmittance from transparent to opaque by applying voltage to embedded electrodes or not applying voltage to the embedded electrodes. Examples of auto shading technology include suspended particle devices and/or electrochromic devices. Outer transparent layers of glass or film are separated by spacers. Transparent conductive coatings or layers are arranged on inwardly facing surfaces of the outer transparent layers. Suspended particles are located between the conductive coatings or layers. When the voltage is applied to the electrodes, the particles align with the applied field and the corresponding portions are transparent. When the voltage is not applied to the electrodes, the particles return to their original orientation and the corresponding portions are opaque.

In some examples, the suspended particles include crystals that are about 0.3 to 0.5 microns (μm) in length, although other types of particles can be used. The crystals act as induced dipoles when an electric field is applied to the conductive coatings or layers in the film. When the electric field is applied, the crystals line up and allow light to pass through. When the electric field is removed, the natural tendency of the crystals is to be misaligned due to Brownian movement. The misaligned crystals cause the glass to tint.

The display device according to the present disclosure provides improved contrast relative to other transparent display devices. When the display device is on and certain conditions are present, voltage to the transparent electrodes surrounding the suspended particles is off. The suspended particles are in a misaligned state, which blocks ambient light and improves the contrast of the display device. When display device is off and certain conditions are present, the switch supplying voltage to the transparent electrodes is on. The suspended particles align and are transparent. In other examples, the selectively transparent material can be transparent when the electrodes are off and opaque when the electrodes are on.

Auto shading activation can be controlled based upon the occurrence of one or more events. For example, auto shading can be transparent when measured ambient light sensed by ambient light sensors is less than a predetermined threshold and opaque when the ambient light is greater than the predetermined threshold. In other examples, auto shading can be activated or deactivated in response to the presence or absence of an occupant inside the vehicle. Auto shading can be activated or deactivated when the vehicle is started or in motion. For example, the auto shading is deactivated when ambient light or interior light is too dim or nobody is in the car for interior facing display applications.

Referring now to FIG. 1A, a transparent display device 100 according to the present disclosure includes a data line 108, a scan line 110, and an array of light emitting diodes (LEDs) 112-11, . . . , and 112-NM, where N and M are integers (collectively LEDs 112) where N and M are integers. A display controller 150 communicates with the data line 108 and the scan line 110. Electrodes 130 and 132 connect the data line 108 and scan line 110 to the LEDs 112 and SPD electrodes 116-1, 116-2, . . . 116-N (collectively SPD electrodes 116) between rows of the LEDs 112. The display controller 150 executes a display application that selectively provides power to the LEDs 112 and/or to the SPD electrodes 116 as will be described further below.

The color of each of the LEDs 112 can be displayed in an on/off mode or at varying intensities between fully on and fully off. In the example shown, the LEDs 112 in each row vary in color (e.g. red, green and blue and then repeat) to form pixels. In some examples, the transparent display device 100 forms part of a windshield, rear glass, side windows, instrument panel, infotainment display, rearview mirror or other window or display.

While an N×M rectangular array is shown, non-uniform layouts can be used with other shapes. Selectively transparent spaces corresponding to the SPD electrodes 116 are arranged between the LEDs 112. The selectively transparent spaces can be configured to be transparent to opaque depending upon applied voltage to the SPD electrodes as will be described further below. As will be described further below, the selectively transparent spaces and the LEDs 112 are arranged in the same plane located between transparent layers as will be described further below in FIGS. 3-4.

Figure 1B:
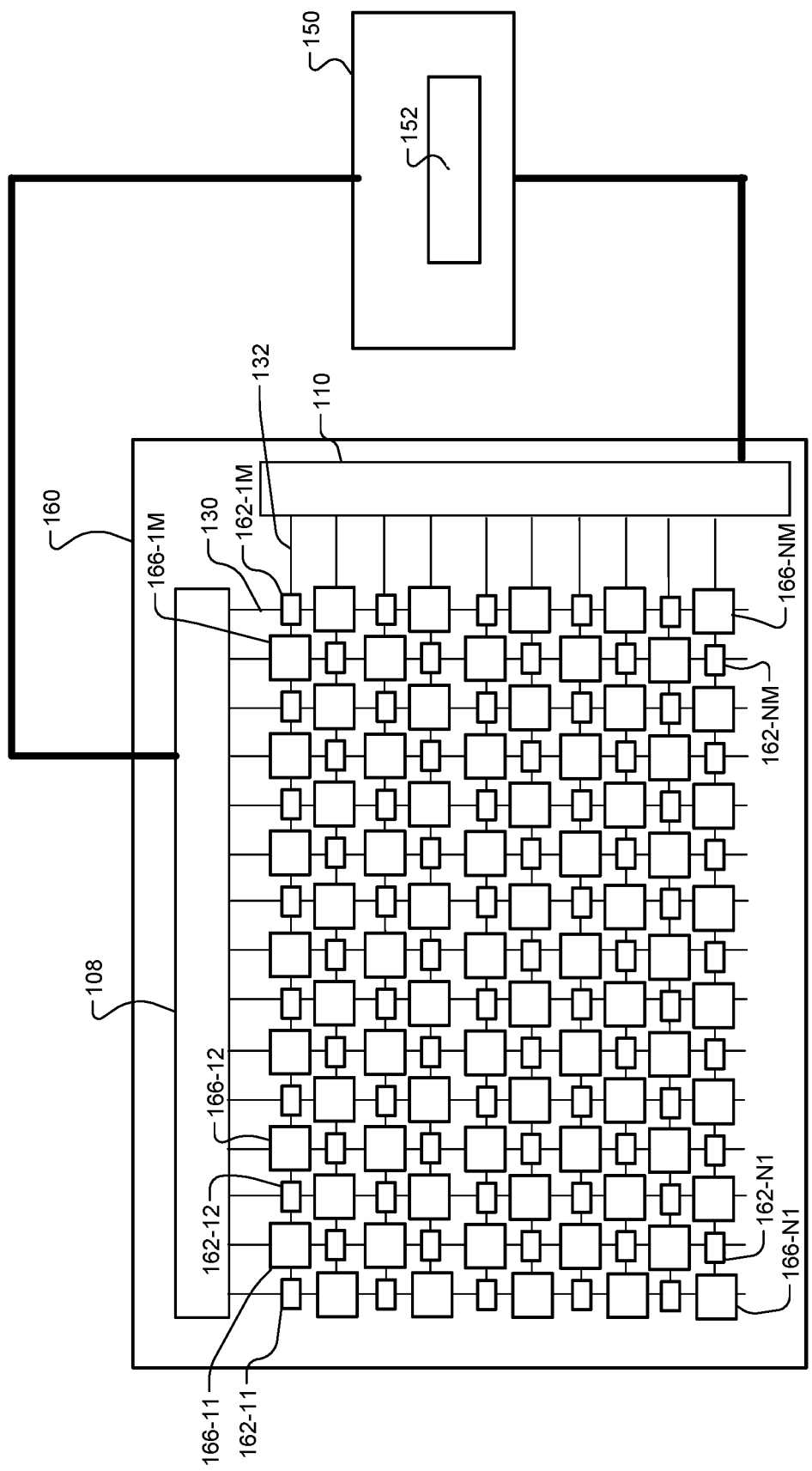

Referring now to FIG. 1B, another display 160 is shown. In FIG. 1A, the LEDs are arranged in a first set of rows. The upper and lower SPD electrodes define a second set of rows that are arranged between each of the first set of rows. In FIG. 1B, the LEDs and pairs of SPD electrodes alternate in both row and/or column directions. The display 160 include an array of LEDs 162-11, 162-12, . . . , and 162-NM (collectively LEDs 162) and an array of SPD electrodes 166-11, 166-12, . . . , and 166-NM (collectively SPD electrodes 166). In each row and/or column, the LEDs 162 alternate with the SPD electrodes 166. In some examples, adjacent rows are aligned with each other or offset from each other to create an alternating pattern in each row and column.

Figure 2:
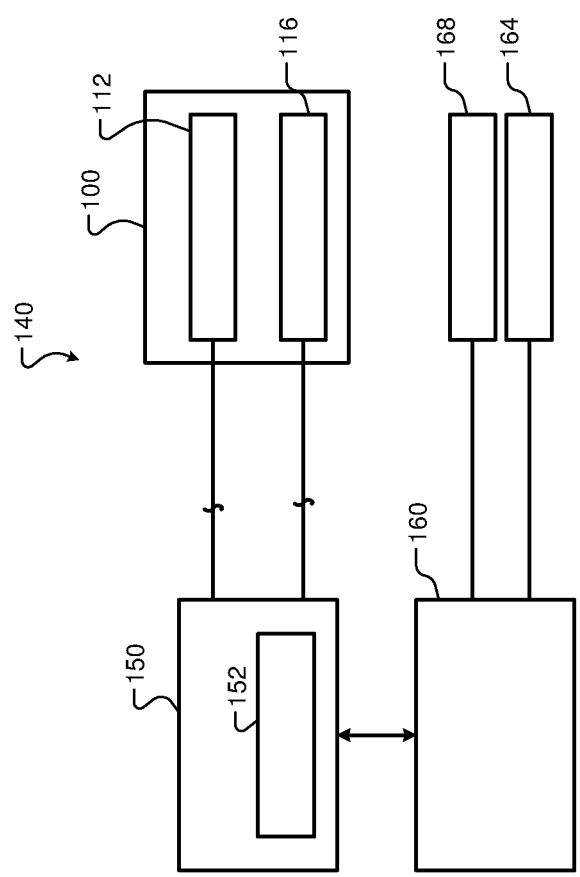
FIG. 2 is a functional block diagram of an example of a control system configured to control the display device of FIG. 1 based on sensor data according to the present disclosure.

Referring now to FIG. 2, an example of a control system 140 configured to control the transparent display device 100 is shown. The display controller 150 is configured to run the display application 152 that controls the LEDs 112 and SPD electrodes 116 of the transparent display device 100. The display application 152 also controls power supplied to the SPD electrodes 116. In some examples, the display application 152 selectively controls switches to apply voltage to the SPD electrodes 116 that determine whether or not the selectively transparent spaces 104 are transparent or opaque based on sensed data such as ambient light conditions or other information.

A vehicle controller 160 may be used to send sensor data or control data (based on sensor data) directly (or indirectly via a vehicle data bus) to the display controller 150. In some examples, an ambient light sensor 164 senses ambient light conditions and the vehicle controller 160 outputs the sensed ambient light measurement to the display controller 150. Alternately, the vehicle controller 160 monitors the ambient light and sends a command specifying the level of opacity to the display controller 150. In other examples, other vehicle sensors 168 output sensed values to the vehicle controller 160 and/or the display controller 150.

Referring now to FIGS. 3 and 4, a transparent display device 200 includes suspended particles arranged in spaces located between LEDs or pixels (including multiple LEDs). In some examples, the transparent display device 200 includes a display side 206 and an opposite side 208. The transparent display device 200 includes selectively transparent regions 210 and LED/pixel regions 212. In some examples, the LED/pixel regions 212 are arranged in an array and are spaced apart at regular intervals by the transparent regions, although non-uniform spacing or other arrangements of pixels can be used.

The transparent display device 200 includes transparent layers 214 and 216 that are spaced apart by a predetermined distance in a direction transverse to a viewing direction of the transparent display device 200. In some examples, the transparent layers 214 and 216 are made of glass, transparent film or other transparent material. In some examples, the transparent regions 210 are spaced apart by spacers 222 that are located between the selectively transparent regions 210 and the LED/pixel regions 212.

In the selectively transparent regions 210, transparent conductive coatings or layers 220 and 224 are arranged in a pattern on inner, facing surfaces of the transparent layers 214 and 216. Suspended particles 228 are located between the conductive coatings or layers 220 and 224. The display controller 150 selectively applies a voltage across the conductive coatings or layers 220 and 224 to change a level of transparency of the selectively transparent regions 210.

When a voltage potential is applied across the transparent conductive coatings or layers 220 and 224, the suspended particles align with the applied field and the selectively transparent region 210 will be transparent as shown in FIG. 3. When the voltage potential is removed, the suspended particles 228 return to a disordered state and the selectively transparent region 210 will be obscured by the suspended particles 228 as shown in FIG. 4.

The LED/pixel regions 212 are located between the selectively transparent regions 210. Each of the LED/pixel regions 212 includes one or more electrodes 272 and one or more LEDs 274. For example only, each of the LED/pixel regions 212 may have three light emitting diodes (LEDs) such as red, green and blue LEDs.

Figure 5:
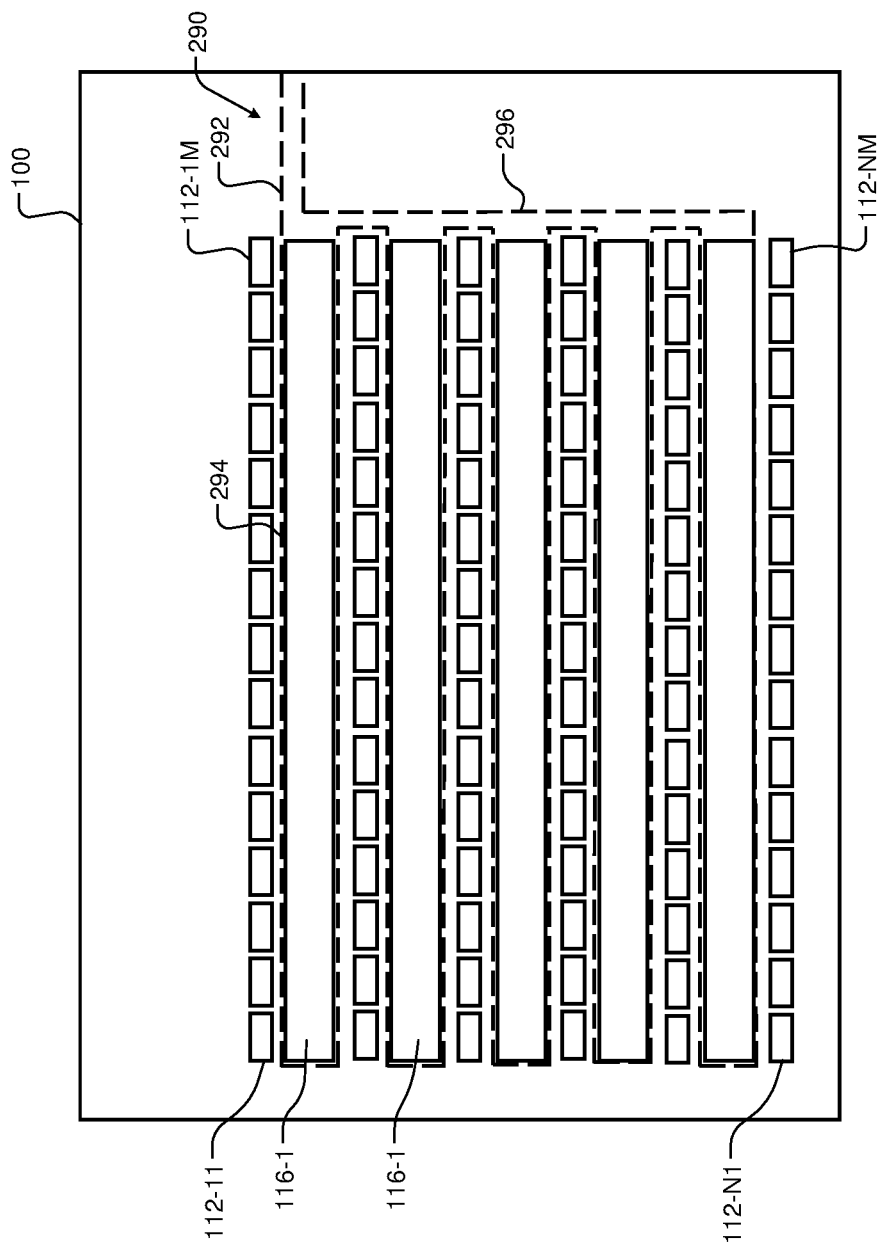
FIG. 5 is a plan view of an example of a spacer pattern according to the present disclosure.

Referring now to FIG. 5, an example of a spacer pattern 290 is shown in dotted lines and includes a first portion 292 extending to a side of the transparent display device 100, fingers 294 extending between the LEDs 112 and aligned with the SPD electrodes 116 and a second portion 296 connecting the first portion to the fingers 294. In some examples, the electrodes are configured so that the designated voltage can be applied to each LED/pixel on the transparent display device to create images, graphics, etc. The electrodes also are configured so that the designated voltage can be applied to each selectively transparent region to adjust the display transparency. The spacer 222 allows the suspended particles to be injected into designated areas. While a single inlet is shown (e.g. along the edge of the display and extending into the first portion 290), multiple inlets can be used. As described above, while a specific arrangement of LEDs, SPD electrodes and spacer patterns are shown, other arrangements are contemplated. Further, while the spacer pattern defines a first region (where LEDs are located) and a single second region where the SPD electrodes are positioned, two or more first regions and/or second regions can be used in a single display.

Figure 6:
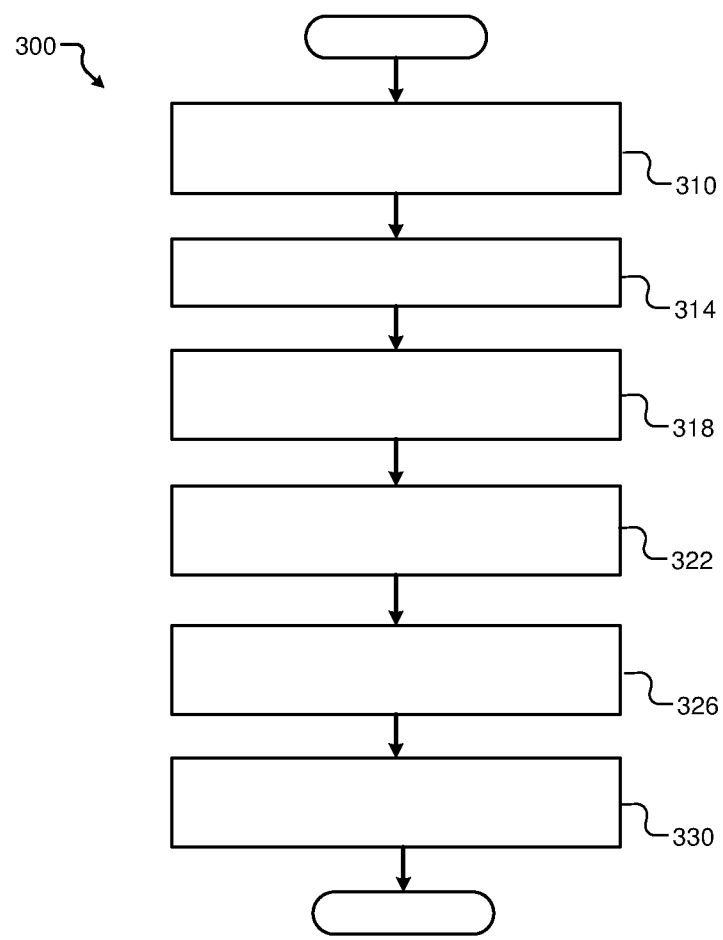
FIG. 6 is a flowchart of an example of a method for fabricating a display device according to the present disclosure.

Referring now to FIG. 6, a method 300 for fabricating a display device is shown. At 310, electrodes are formed on an inner surface of first and second transparent layers. The electrodes can be formed using any suitable process including photolithography, silk screening, printing or other processes. At 314, LEDs are arranged in selected locations on the electrodes of the first transparent layer. In some examples, the LEDs are picked, placed onto and bonded to the electrodes of the first transparent layer. In other examples, other methods are used.

At 318, the second transparent layer is aligned with and arranged on the first transparent layer. At 322, the second transparent layer is arranged on the spacers and over the first transparent layer. The first and second transparent layers are sealed at 326. Particles are injected into the transparent regions located between the LED/pixel regions at 330.

Referring now to FIG. 7, a method 350 for operating a display device viewed from inside of a vehicle is shown. At 354, the method determines whether the display is on. If 354 is false, the selectively transparent regions can be set to either transparent or opaque depending upon other conditions. If 354 is true and the display is on, the method measures ambient light level outside of the vehicle. If the measured ambient light level is not greater than a threshold TH1 as determined by 358, then the selectively transparent regions can be set to be either transparent or opaque depending upon the needs of a particular application. In other words, the selectively transparent regions may be controlled based on other factors (independently of the display) until the display is turned on.

If the measured ambient light level is greater than a threshold TH1 as determined by 358, then the selectively transparent regions are set to opaque to increase the contrast of the display at 362. In some examples, the threshold TH1 is used as a threshold to distinguish daylight levels from nighttime levels.

Referring now to FIG. 8, a method 370 for operating a display device viewed from outside of a vehicle is shown. At 374, the method determines whether the display is on. If 374 is false, the selectively transparent regions of the display device can be set to either transparent or opaque depending on the needs of a particular application. If 374 is true and the display is on, the method determines whether inside light levels are greater than a predetermined light level. The predetermined light level may be presumed based on on/off settings of interior lights and/or light levels measured by one or more light sensor(s). If inside light levels are greater than a predetermined level as determined by 358, then the selectively transparent regions are set to opaque 380. If the inside light level is less than the predetermined light level as determined by 358, then the selectively transparent regions are set to either transparent or opaque depending on the needs of a particular application at 382.

Figure 9:
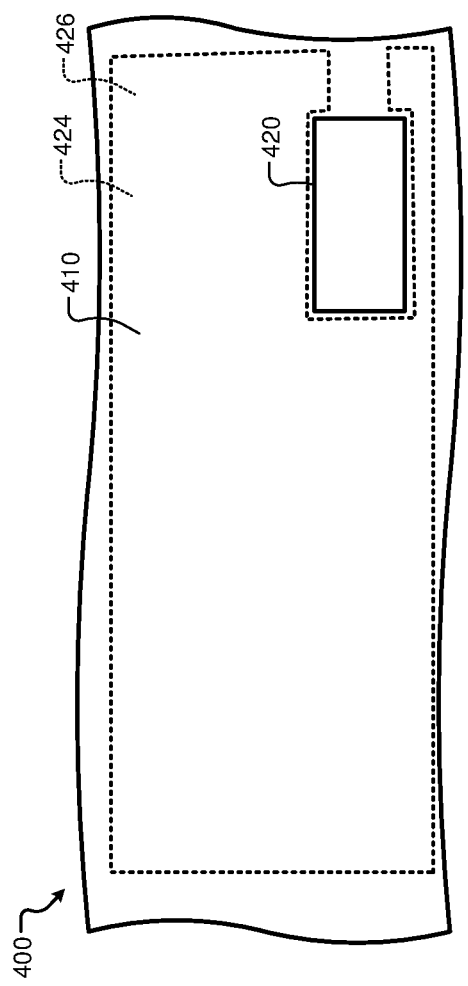
FIG. 9 illustrates a window with auto shading and including a portion including a transparent display device according to the present disclosure.

Referring now to FIG. 9, mixed shading modes can be used. For example, a window 400 includes a first portion 410 with auto shading but not a display. The window 400 includes a second portion 420 including a display device 422 as described above. In some examples, the first portion 410 may be selectively transparent while shading is performed in transparent regions of the display device 422. In other examples, the first portion 410 may be selectively opaque while transparent regions of the display device 422 are transparent. The display device 422 can be outputting images or not outputting images in either of these examples. When the regions are to be controlled separately, SPD electrodes for these regions are not connected together and are separately powered or not powered.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A display device comprising:
a first transparent layer;
a second transparent layer;
a spacer arranged between the first transparent layer and the second transparent layer to define a first region and a second region;
a first plurality of electrodes arranged on an inner surface of the first transparent layer in the first region;
a plurality of light emitting diodes (LEDs) connected to the first plurality of electrodes in the first region;
a second plurality of electrodes arranged on the inner surface of the first transparent layer in the second region;
a third plurality of electrodes arranged on the inner surface of the second transparent layer in the second region; and
particles arranged in the second region between the second plurality of electrodes and the third plurality of electrodes.

2. The display device of claim 1, further comprising a display controller configured to selectively cause the particles between the second plurality of electrodes and the third plurality of electrodes to align to increase transparency of the display device in the second region.

3. The display device of claim 2, wherein the display controller is configured to selectively cause the particles between the second plurality of electrodes and the third plurality of electrodes to misalign and increase opacity of the display device in the second region.

4. The display device of claim 1, wherein the plurality of LEDs comprise micro LEDs.

5. The display device of claim 1, wherein the first transparent layer comprises glass.

6. The display device of claim 1, wherein the first transparent layer comprises transparent film.

7. The display device of claim 1, wherein the second transparent layer comprises glass.

8. The display device of claim 1, wherein the second transparent layer comprises transparent film.

9. The display device of claim 1, wherein the first plurality of electrodes, the second plurality of electrodes and the third plurality of electrodes comprise a conductive coating.

10. The display device of claim 1, wherein the display device forms part of a windshield of a vehicle.

11. The display device of claim 1, wherein the display device forms part of a window of a vehicle.

12. The display device of claim 1, wherein the display device is viewed from an interior of a vehicle.

13. The display device of claim 12, further comprising a display controller configured to cause the second region to be opaque in response to an ambient light level being greater than a predetermined light threshold.

14. The display device of claim 1, wherein the display device is viewed from an exterior of a vehicle.

15. The display device of claim 14, further comprising a display controller configured to cause the second region to be opaque in response to a light level inside the vehicle being greater than a predetermined value.

16. The display device of claim 1, wherein the first plurality of electrodes are configured to supply power individually to each of the plurality of LEDs.

17. The display device of claim 1, further comprising:
a fourth plurality of electrodes arranged on the inner surface of the first transparent layer in the second region; and
a fifth plurality of electrodes arranged on the inner surface of the second transparent layer in the second region,
wherein the fourth plurality of electrodes and the fifth plurality of electrodes are not connected to the third plurality of electrodes and the fourth plurality of electrodes.

18. The display device of claim 1, wherein the plurality of LEDs are arranged in a first set of rows and the second plurality of electrodes and the third plurality of electrodes define a second set of rows that are arranged between ones of the first set of rows.

19. The display device of claim 1, wherein the plurality of LEDs and pairs of the second plurality of electrodes and the third plurality of electrodes alternate in both row and column directions.

20. A method for fabricating a display device, comprising:
forming a first plurality of electrodes in first regions of an inner surface of a first transparent layer;
forming a second plurality of electrodes in second regions of the inner surface of the first transparent layer;
forming a third plurality of electrodes in second regions of an inner surface of a second transparent layer;
attaching LEDs on the first plurality of electrodes;
forming spacers on at least one of the first transparent layer and the second transparent layer between the first regions and the second regions;
arranging the first transparent layer parallel to the second transparent layer with the second plurality of electrodes on the first transparent layer aligned with the third plurality of electrodes on the second transparent layer; and
injecting particles into the second regions.

* * * * *